(12) United States Patent
Chang et al.

(10) Patent No.: US 6,583,067 B2
(45) Date of Patent: Jun. 24, 2003

(54) METHOD OF AVOIDING DIELECTRIC LAYER DETERIORATION WITH A LOW DIELECTRIC CONSTANT

(75) Inventors: Ting-Chang Chang, Hsin-Chu (TW); Po-Tsun Liu, Hsin-Chu (TW); Yi-Shien Mor, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 132 days.

(21) Appl. No.: 09/681,987

(22) Filed: Jul. 3, 2001

(65) Prior Publication Data

US 2003/0008518 A1 Jan. 9, 2003

(51) Int. Cl.$^7$ ................................. H01L 21/00
(52) U.S. Cl. ........................ 438/723; 216/79; 216/67; 438/725; 438/743
(58) Field of Search .................. 438/723, 725, 438/743, 745, 756; 216/67, 79

(56) References Cited

U.S. PATENT DOCUMENTS 6,184,142 B1 * 2/2001 Chung et al. ............... 438/692

* cited by examiner

Primary Examiner—William A. Powell
(74) Attorney, Agent, or Firm—Winston Hsu

(57) ABSTRACT

The present invention is a method to avoid deterioration of a dielectric characteristic of a dielectric layer having a low dielectric constant (low k) during a stripping process. The method involves first forming a low k dielectric layer on the surface of a substrate of a semiconductor wafer. Then, a patterned photoresist layer is formed over the surface of the low k dielectric layer. The patterned photoresist layer is then used as a hard mask to perform an etching process on the low k dielectric layer. A stripping process is then performed to remove the patterned photoresist layer. Finally, a surface treatment is utilized on the low k dielectric layer to remove Si—OH bonds in the low k dielectric layer so as to avoid moisture absorption of the low k dielectric layer that causes deterioration of the dielectric characteristic.

19 Claims, 6 Drawing Sheets

METHOD OF AVOIDING DIELECTRIC LAYER DETERIORATION WITH A LOW DIELECTRIC CONSTANT

BACKGROUND OF INVENTION

1. Field of the Invention

The present invention provides a method for avoiding deterioration of a dielectric characteristic of a dielectric layer having a low dielectric constant (low k), during a stripping process.

2. Description of the Prior Art

With the decreasing size of semiconductor devices and an increase in integrated circuits (IC) density, RC time delay, produced between the metal wires, seriously affects IC performance and reduces the IC working speed. RC time delay effects are more obvious especially when the line width is reduced to 0.25 $\mu$m, even 0.13 $\mu$m in a semiconductor process.

RC time delay produced between metal wires is the product of the electrical resistance (R) of the metal wires and the parasitic capacitance (C) of the dielectric layer between metal wires. However there are two approaches to reduce RC time delay: a) using conductive materials with a lower resistance as a metal wire or, b) reducing the parasitic capacitance of the dielectric layer between metal wires. In the approach of using a metal wire with a lower resistance, copper interconnection technology replaces the traditional Al:Cu(0.5%) alloy fabrication process and is a necessary tendency in multilevel metallization processes. Due to copper having a low resistance (1.67 $\mu\Omega$-cm) and higher current density load without electro-migration in the Al/Cu alloy, the parasitic capacitance between metal wires and connection levels of metal wires is reduced. However, reducing RC time delay produced between metal wires by only copper interconnection technology is not enough. Also, some fabrication problems of copper interconnection technology need to be solved. Therefore, it is more and more important to reduce RC time delay by the approach of reducing the parasitic capacitance of the dielectric layer between metal wires.

Additionally, the parasitic capacitance of a dielectric layer is related to the dielectric constant of the dielectric layer. If the dielectric constant of the dielectric layer is lower, the parasitic capacitance of the dielectric layer is lower. Traditionally silicon dioxide (dielectric constant is 3.9) cannot meet the present requirement of 0.13 $\mu$m in semiconductor processes, so some new low k materials, such as polyimide (PI), FPI, FLARE™, PAE-2, PAE-3 or LOSP are thereby consecutively proposed.

Unfortunately, these low k materials are composed of carbon, hydrogen and oxygen and have significantly different compositions to those of traditional silicon dioxide used in etching or adhering with other materials. Most of these low k materials have some disadvantages such as poor adhesion and poor thermal stability, so they cannot properly integrated into current IC fabrication processes.

Therefore, another kind of low k dielectric layer, such as HSQ (hydrogen silsesquioxane) (k=2.8), MSQ (methyl silsesquioxane)(k=2.7), HOSP (k=2.5), H-PSSQ (hydrio polysilsesquioxane), M-PSSQ (methyl polysilsesquioxane), P-PSSQ (phenyl polysilsesquioxane)and porous sol-gel (K<2), using the silicon dioxide as a base and adding some carbon and hydrogen elements inside is needed. These silicon based low k materials have potential in the future since properties of these materials closely resemble traditional silicon dioxide and can be easily integrated into current IC fabrication processes.

However, when patterning a dielectric layer composed of silicon dioxide based low k materials, the dielectric layer suffers some damage during etching or stripping process. Since the stripping process usually uses dry oxygen plasma ashing and wet stripper to remove a photoresist layer, the bonds in the surface of the dielectric layer are easily broken by oxygen plasma bombardment and react with oxygen ions and wet stripper to form moisture-absorbing Si—OH bonds. Since the dielectric constant of water is very high (k=78), the dielectric constant of the moisture-absorbing dielectric layer increases so resulting in a loss of the low dielectric constant characteristic. Moreover, the absorbed moisture in the low k dielectric layer also causes current leakage to increase so that the low k dielectric layer has a poor isolating characteristic, and even the phenomenon of poison via occurs, thereby seriously affecting the reliability of products.

SUMMARY OF INVENTION

It is therefore a primary objective of the present invention to provide a method for avoiding deterioration of a dielectric characteristic of a dielectric layer having a low dielectric constant, during a stripping process, to solve the above-mentioned problems.

In accordance with the claim invention, the method involves first forming a low k dielectric layer on a surface of a substrate of a semiconductor wafer. Then, a patterned photoresist layer is formed over the surface of the low k dielectric layer. The patterned photoresist layer is then used as a hard mask to perform an etching process on the low k dielectric layer. A stripping process is then performed to remove the patterned photoresist layer. Finally, hexamethyidisilazane (HMDS) is used to perform a surface treatment on the low k dielectric layer to remove Si—OH bonds in the low k dielectric layer.

The present invention uses HMDS to repair the surface of the low k dielectric layer that is damaged during the stripping process. Therefore, the damaged low k dielectric layer recovers to have its original dielectric characteristic so avoiding moisture absorption of the low k dielectric layer leading to deterioration of the dielectric characteristic.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
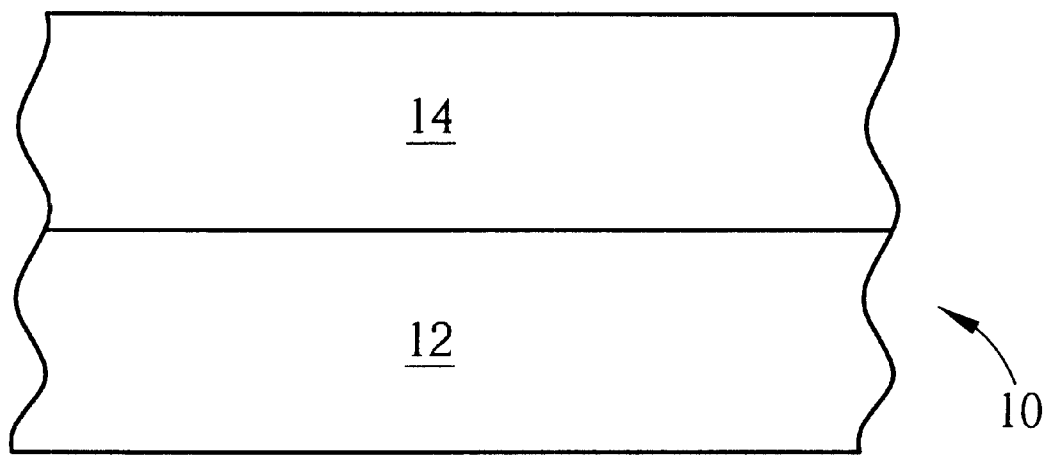
FIG. 1 to FIG. 4 are schematic diagrams of performing an etching process in a low k dielectric layer according to the present invention.

Please refer to FIG. 1 to FIG. 4 of schematic diagrams of performing an etching process in a low k dielectric layer. As shown in FIG. 1, a semiconductor wafer 10 comprises a silicon substrate 12 and a low k dielectric layer 14. The low k dielectric layer 14 is formed on a surface of the silicon substrate 12 by chemical vapor deposition (CVD) or spin-on method. Wherein, the low k dielectric layer 14 is composed of dielectric materials based on silicon dioxide such as HSQ (hydrogen silsesquioxane) (k=2.8), MSQ (methyl silsesquioxane) (k=2.7), HOSP (k=2.5), H-PSSQ (hydrio polysilsesquioxane), M-PSSQ (methyl polysilsesquioxane), P-PSSQ (phenyl polysilsesquioxane) or porous sol-gel (K<2).

Figure 2:
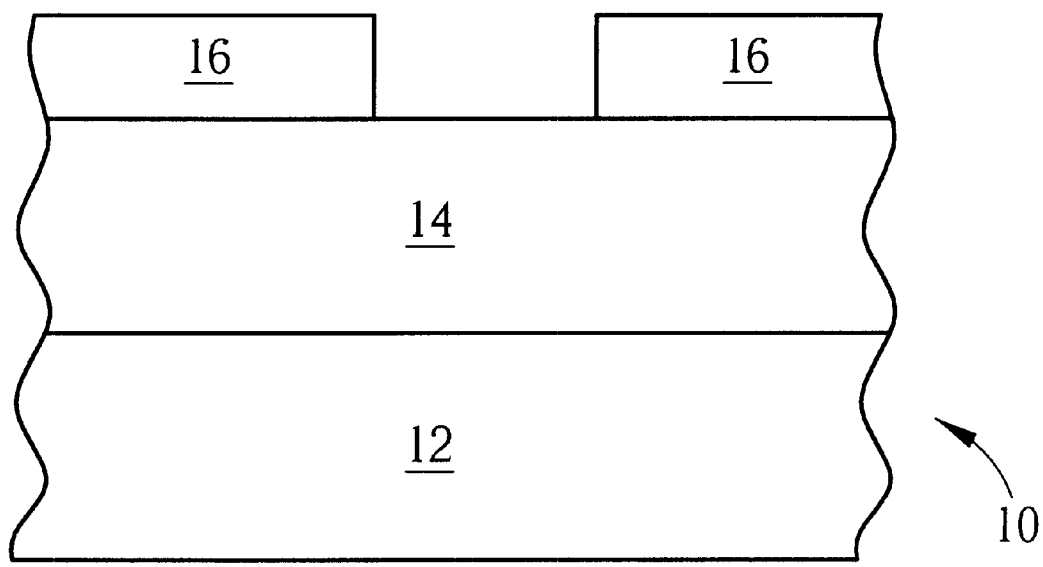
Figure 3:
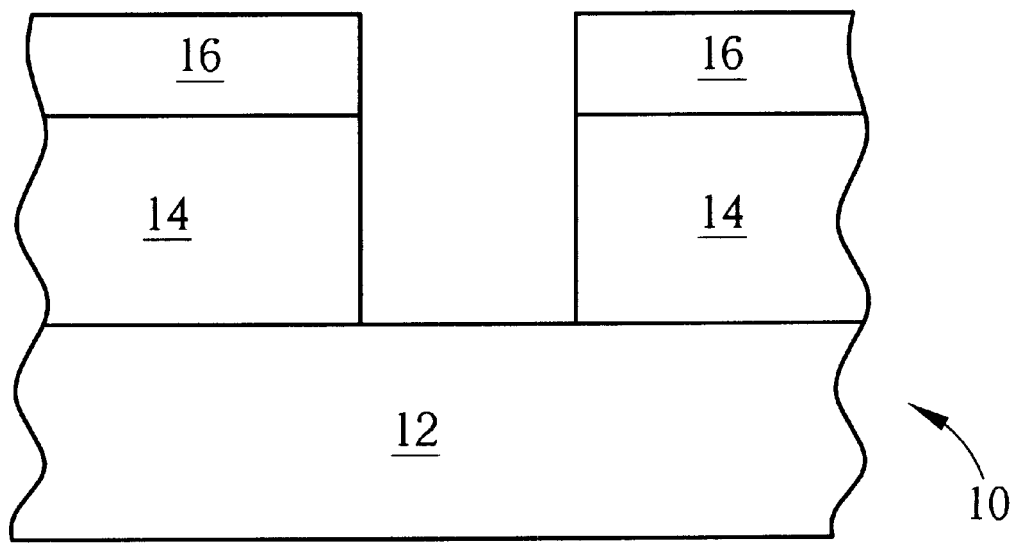

Then, as shown in FIG. 2, a photoresist layer 16 is coated on the surface of the low k dielectric layer 14. A lithography process is used to define an etching pattern in the photoresist layer 16. As shown in FIG. 3, the patterned photoresist layer 16 is then used as a hard mask to etch the low k dielectric layer 14. Thus, the etching pattern is transferred to the low k dielectric layer 14.

Figure 4:
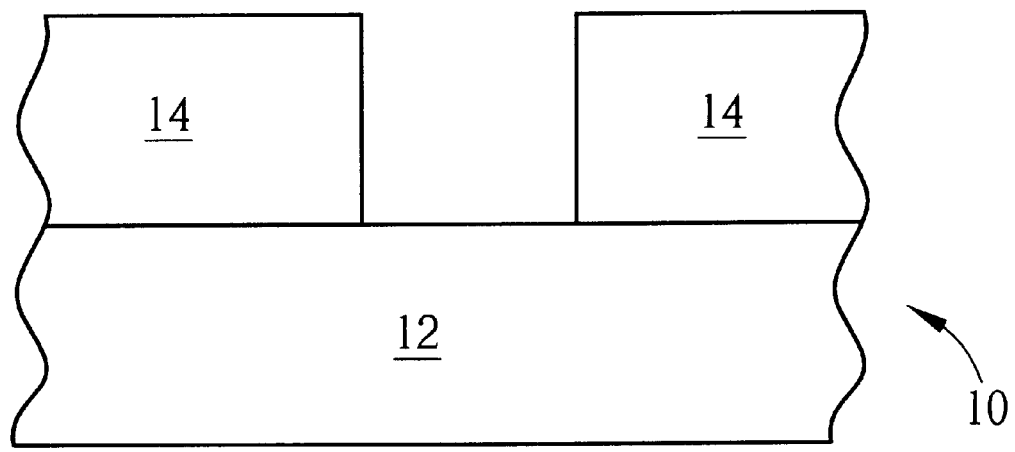

As shown in FIG. 4, a stripping process is performed. That is, a plasma ashing process is used to perform reactive ion etch in the photoresist layer 16. The oxygen plasma reacts with carbon and hydrogen atoms in the photoresist layer 16 to form gaseous carbon dioxide and water vapor so as to strip the photoresist layer 16. Then, the semiconductor wafer 10 is placed in a wet stripper such as hydroxyamine or ethanolamine to remove the photoresist layer 16 remaining on the surface of the low k dielectric layer 14. Wherein, since the surface of the low k dielectric layer 14 is damaged by oxygen plasma and wet stripper during stripping process, moisture absorbing Si—OH bonds are formed in the low k dielectric layer 14 so as to increase the dielectric constant and current leakage of the low k dielectric layer 14.

Figure 5:
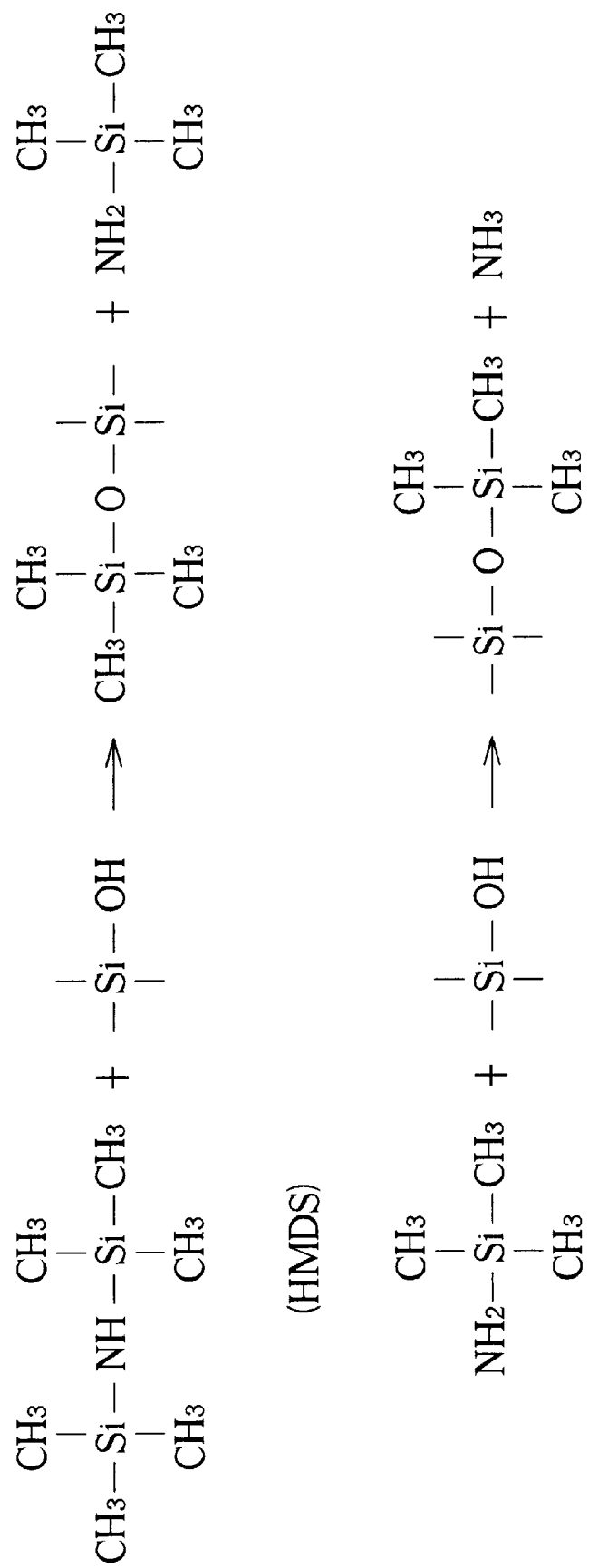
FIG. 5 is a chemical reaction formula of HMDS and the low k dielectric layer.

Finally, a surface treatment is performed on the low k dielectric layer 14 of the semiconductor wafer 10. That is, the semiconductor wafer 10 is immersed in a 5–15% hexamethyidisilazane (HMDS) hexane solution, or the semiconductor wafer 10 is placed in a HMDS vapor-containing environment. Therefore, the HMDS reacts with Si—OH bonds in the surface of the low k dielectric layer 14 to eliminate the Si—OH bonds. FIG. 5 shows the reaction between HMDS and the Si—OH of the low k dielectric layer 14. As shown in FIG. 5, Si—OH bonds react with HMDS to form Si—OSi(CH$_3$)$_3$. Following this chemical reaction step, not only the Si—OH bonds in the low k dielectric layer 14 are eliminated to repair the low k dielectric layer 14 that is damaged during the stripping process, but also the surface of the low k dielectric layer is changed from hydrophilic to hydrophobic. Therefore, the hydrophobic surface can prevent moisture absorption in the following process environment, and the characteristic of the low k dielectric layer 14 is recovered. A furnace baking process can be performed for 30 minutes at a temperature of 400° C. to remove the HMDS remains on the low k dielectric layer 14 thus completing the present method.

Figure 6:
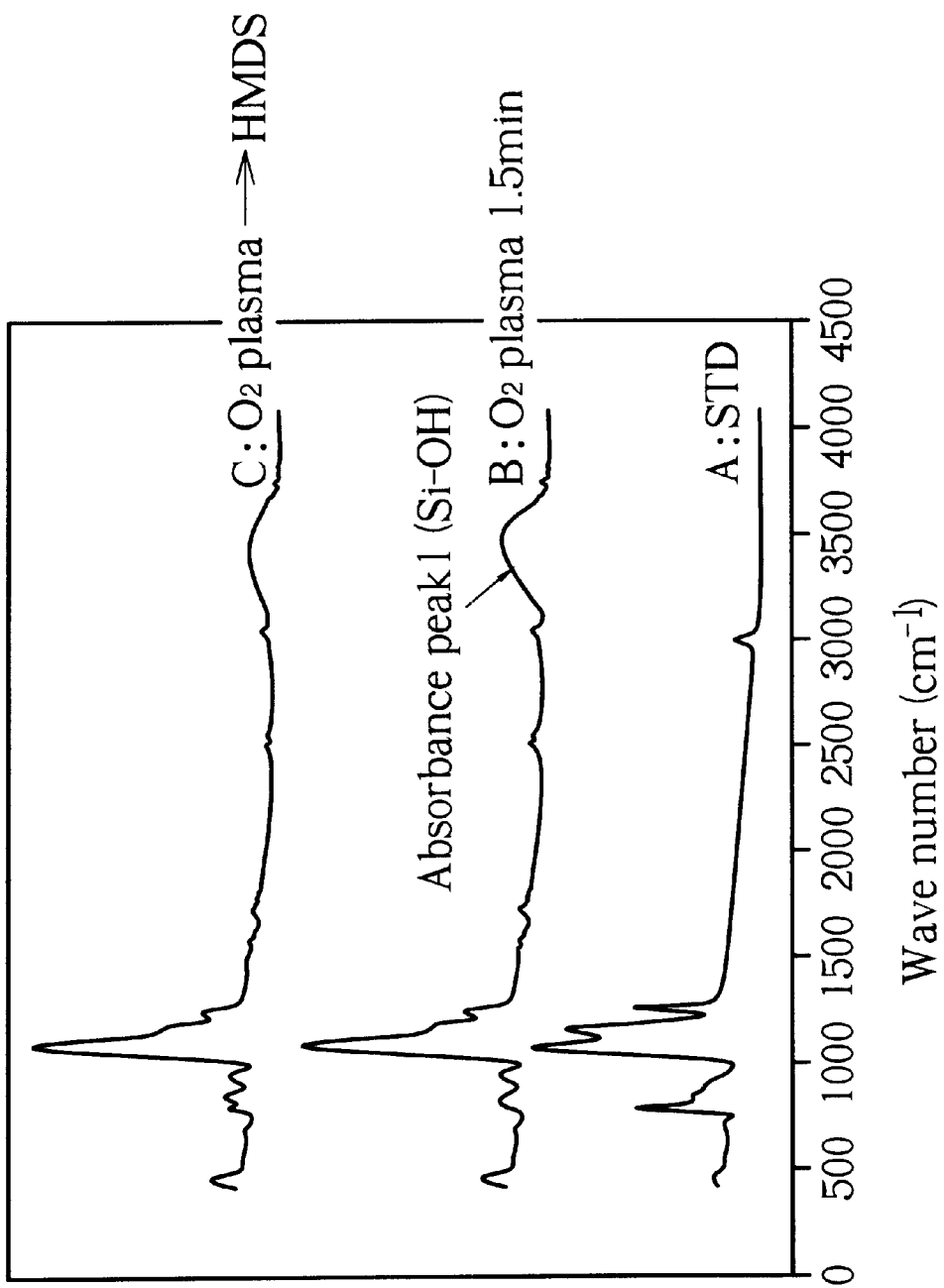
FIG. 6 is an infrared spectroscopy of a porous sol-gel dielectric layer.

Please refer to FIG. 6 of an infrared spectroscopy of the porous sol-gel dielectric layer. Curves A and B represent an infrared spectroscopy of the porous sol-gel dielectric layer before and after an O$_2$ plasma stripping process, respectively. Curve C represents an infrared spectroscopy of the porous sol-gel dielectric layer performing an HMDS surface treatment after the O$_2$ plasma stripping process. Wherein, the absorption peak 1 represents the absorption of Si—OH bonds, which absorb infrared rays to 3000–3500 cm$^{-1}$. As shown in FIG. 6, the porous sol-gel dielectric layer obviously forms the peak 1 of Si—OH bonds after the stripping process. And the absorption of Si—OH bonds in the porous sol-gel dielectric layer is reduced after HMDS surface treatment.

Figure 7:
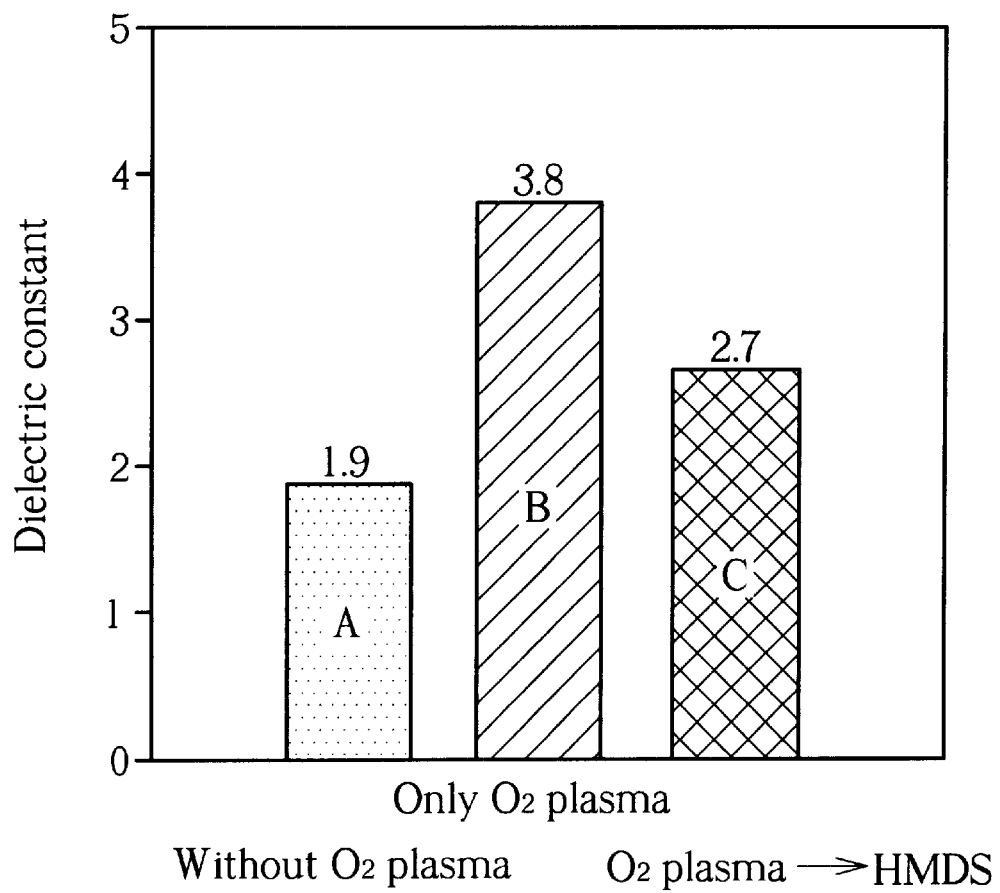
FIG. 7 is a bar chart of the dielectric constant of the porous sol-gel dielectric layer.

Please refer to FIG. 7 of a bar chart of the dielectric constant of the porous sol-gel dielectric layer. Dot square A and diagonal square B represent the dielectric constant of the dielectric layer before and after O$_2$ plasma stripping process, respectively. Latticed square C represents the dielectric constant of the dielectric layer on performing HMDS surface treatment after the O$_2$ plasma stripping process. As shown in FIG. 7, the dielectric constant of the porous sol-gel dielectric layer is increased from 1.9 to 3.8 after the stripping process, and the dielectric constant is recovered to 2.7 after performing the HMDS surface treatment. It shows that HMDS can repair the damaged structure of the porous sol-gel dielectric layer and improve the problem of the low dielectric constant.

Figure 8:
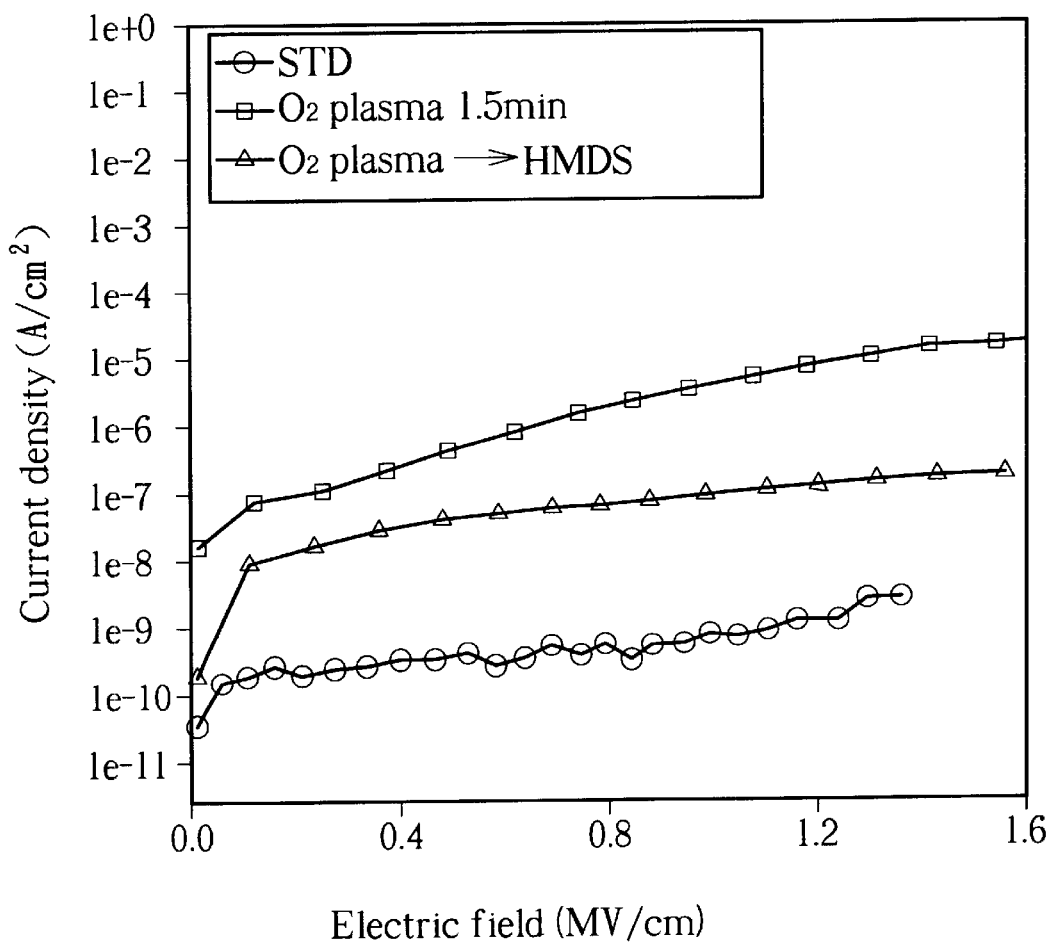
FIG. 8 is the relationship between an electrical field and a current leakage density of the porous sol-gel dielectric layer.

Please refer to FIG. 8 of a graph of a relationship between an electrical field and a current leakage density in the porous sol-gel dielectric layer. Circle signs and Square signs represent the relationship of the electric field and the current leakage density in porous sol-gel dielectric layer before and after the O$_2$ plasma stripping process, respectively. Triangle signs represent the relationship of the electric field and the current leakage density in porous sol-gel dielectric layer in performing the HMDS surface treatment after the O$_2$ plasma stripping process. As shown in FIG. 8, the current leakage density of the dielectric layer before stripping process is very low at about $10^{-10}$ to $10^{-9}$ A/cm$^2$. But after stripping process, the current leakage density of the dielectric layer is increased by a factor of 1,000 or 10,000. Also, when performing the HMDS treatment after the stripping process, the current leakage density of the dielectric layer is decrease by a factor of 10 or 100. It shows that HMDS can really repair the damaged structure of the dielectric layer caused by the stripping process and improve the problem of current leakage increase.

Above all, since the silicon dioxide based low k dielectric layer is easily damaged to form Si—OH bonds during the stripping process, the dielectric characteristic of the low k dielectric layer is affected. Thus, the present invention immerses the damaged and Si—OH forming low k dielectric layer in the HMDS solution or in a HMDS vapor environment to cause the reaction between HMDS and Si—OH. Therefore, the Si—OH bonds in the low k dielectric layer are eliminated to inhibit the moisture absorption and reduce the dielectric constant and current leakage increasing in the low k dielectric layer so as to maintain the excellent dielectric characteristic of the low k dielectric layer.

In contrast to the prior art method of etching silicon dioxide based low k dielectric layer, the present invention uses HMDS to repair the surface of the low dielectric layer that is damaged during the stripping process. Therefore, the Si—OH bonds are eliminated and the properties of the surface of the low k dielectric layer change to hydrophobic. Consequently, moisture absorption is prevented to solve problems such as dielectric constant and current leakage increase, as shown in the prior art and avoid the deterioration of dielectric characteristic in the low k dielectric layer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for avoiding deterioration of a dielectric characteristic of a patterned dielectric layer having a low dielectric constant (low k), the patterned dielectric layer formed on a surface of a substrate, the method performing a surface treatment on the patterned low k dielectric layer to remove Si—OH bonds on the patterned low k dielectric layer to avoid moisture absorption of the patterned low k dielectric layer that causes deterioration of the dielectric characteristic.

2. The method of claim 1 wherein the substrate is a silicon substrate provided by a silicon wafer.

3. The method of claim 1 wherein the method of forming the patterned low k dielectric layer comprises:

forming a low k dielectric layer on the substrate;

forming a patterned photoresist layer on the low k dielectric layer;

using the photoresist layer as a hard mask to perform an etching process on the low k dielectric layer; and performing a stripping process.

4. The method of claim 3 wherein the low k dielectric layer is HSQ hydrogen (silsesquioxane), MSQ (methyl silsesquioxane), H-PSSQ (hydrio polysilsesquioxane), M-PSSQ (methyl polysilsesquioxane), P-PSSQ (phenyl polysilsesquioxane), PAE-2, HOSP, or porous sol-gel.

5. The method of claim 4 wherein the low k dielectric layer is formed on the substrate by performing a chemical vapor deposition (CVD) process, or a spin-on process.

6. The method of claim 3 wherein the surface treatment is used to remove Si—OH bonds formed on the patterned low k dielectric layer after performing the etching process and the stripping process.

7. The method of claim 1 wherein the surface treatment uses a solution containing hexamethyldisilazane (HMDS) to react with the surface of the patterned low k dielectric layer to remove the Si—OH bonds in the patterned low k dielectric layer.

8. The method of claim 7 wherein the solution is formed by dissolving 5 to 15% HMDS into hexane.

9. The method of claim 8 further comprising a hot baking process at a temperature of 400° C. for 30 minutes to remove HMDS remaining on the surface of the patterned low k dielectric layer.

10. The method of claim 1 wherein the surface treatment uses HMDS vapor to react with the surface of the patterned low k dielectric layer to remove the Si—OH bonds in the patterned low k dielectric layer.

11. The method of claim 1 wherein the surface treatment is used to cause the surface of the patterned low k dielectric layer to become a hydrophobic layer.

12. A method for avoiding deterioration of a dielectric characteristic of a low k dielectric layer, the dielectric layer formed on a surface of a substrate, the method comprising:

performing a surface treatment on the low k dielectric layer that uses HMDS to remove Si—OH bonds on the low k dielectric layer to avoid moisture absorption of the low k dielectric layer that causes deterioration of the dielectric characteristic.

13. The method of claim 12 wherein the substrate is a silicon substrate provided by a silicon wafer.

14. The method of claim 12 wherein the low k dielectric layer is HSQ, MSQ, H-PSSQ, M-PSSQ, P-PSSQ, PAE-2, HOSP, ox porous sol-gel.

15. The method of claim 14 wherein the low k dielectric layer is formed on the substrate by performing a chemical vapor deposition (CVD) process, or a spin-on process.

16. The method of claim 12 wherein the HMDS is dissolved in hexane, and the volume percentage concentration of HMDS is about 5 to 15%.

17. The method of claim 12 wherein HMDS in a vapor phase is used to perform the surface treatment.

18. The method of claim 12 wherein the low k dielectric layer is a patterned thin film layer.

19. The method of claim 12 wherein the surface treatment is used to cause the surface of the low k dielectric layer to become a hydrophobic layer.

* * * * *